(12) United States Patent
Wu et al.

(10) Patent No.: US 9,728,511 B2
(45) Date of Patent: Aug. 8, 2017

(54) SEMICONDUCTOR WAFER AND SEMICONDUCTOR DIE

(71) Applicant: Taiwan Semiconductor Manufacturing CO., LTD., Hsinchu (TW)

(72) Inventors: Hsi-Jung Wu, Kaohsiung (TW); Volume Chien, Tainan (TW); Ying-Lang Wang, Taichung (TW); Hsin-Chi Chen, Tainan (TW); Ying-Hao Chen, Tainan (TW); Hung-Ta Huang, Tainan (TW)

(73) Assignee: Taiwan Semiconductor Manufacturing Co., Ltd., Hsinchu (TW)

( * ) Notice: Subject to any disclaimer, the term of this patent is extended or adjusted under 35 U.S.C. 154(b) by 0 days.

(21) Appl. No.: 14/109,162

(22) Filed: Dec. 17, 2013

(65) Prior Publication Data

US 2015/0170985 A1 Jun. 18, 2015

(51) Int. Cl.
*H01L 23/544* (2006.01)
*H01L 23/00* (2006.01)
*H01L 23/58* (2006.01)
*H01L 21/784* (2006.01)

(52) U.S. Cl.
CPC ......... *H01L 23/562* (2013.01); *H01L 21/784* (2013.01); *H01L 23/585* (2013.01); *H01L 2924/0002* (2013.01); *H01L 2924/14* (2013.01)

(58) Field of Classification Search
CPC . H01L 27/1464; H01L 23/562; H01L 23/585; H01L 21/784; B81C 1/00873

USPC .......................................................... 257/620
See application file for complete search history.

(56) References Cited

U.S. PATENT DOCUMENTS

| | | | | |
|---|---|---|---|---|
| 5,831,330 | A * | 11/1998 | Chang | 257/620 |
| 2007/0105370 | A1* | 5/2007 | Kinderknecht et al. | 438/637 |
| 2008/0128864 | A1* | 6/2008 | Cho | 257/620 |
| 2008/0265378 | A1* | 10/2008 | Lee et al. | 257/620 |
| 2010/0200960 | A1* | 8/2010 | Angyal | H01L 23/585 257/620 |
| 2010/0244287 | A1* | 9/2010 | Hsu | G03F 7/70633 257/797 |
| 2011/0006404 | A1* | 1/2011 | Lee et al. | 257/620 |
| 2011/0140245 | A1* | 6/2011 | Lane | H01L 21/563 257/620 |
| 2012/0038020 | A1* | 2/2012 | Lin et al. | 257/503 |
| 2012/0038028 | A1* | 2/2012 | Yaung et al. | 257/620 |
| 2012/0156823 | A1* | 6/2012 | Myung | H01L 21/78 438/65 |
| 2013/0043470 | A1* | 2/2013 | Huang | H01L 23/562 257/48 |

(Continued)

*Primary Examiner* — Sitaramarao S Yechuri

(57) ABSTRACT

A semiconductor wafer includes a substrate, an integrated circuit and a die seal ring structure. The substrate is with a die region, a die seal ring region surrounding the die region and a scribe line region surrounding the die seal ring region. The substrate includes a first surface and a second surface opposite to the first surface, and periodic recesses within the first surface of the die seal ring region, the scribe line region or both the die seal ring region and the scribe line region. The integrated circuit is located on the first surface and the second surface of the die region. The die seal ring structure is located on the second surface of the die seal ring region. A semiconductor die is also provided.

20 Claims, 7 Drawing Sheets

(56) References Cited

U.S. PATENT DOCUMENTS

2014/0124889 A1* 5/2014 Qian et al. .................. 257/448

* cited by examiner

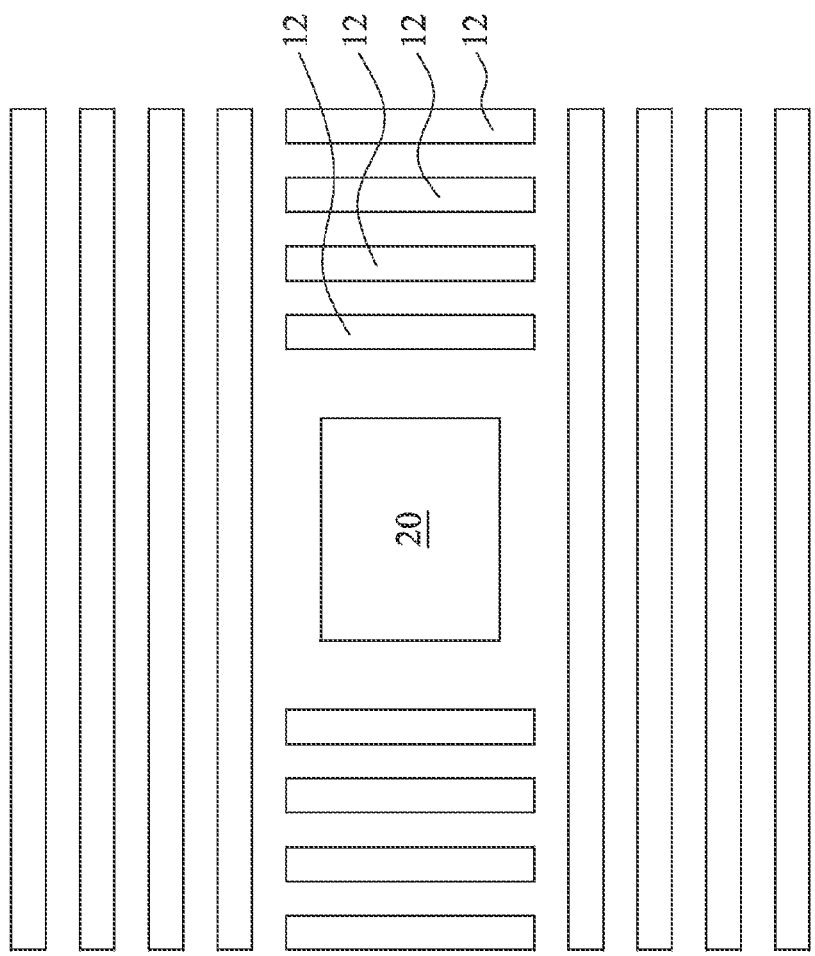

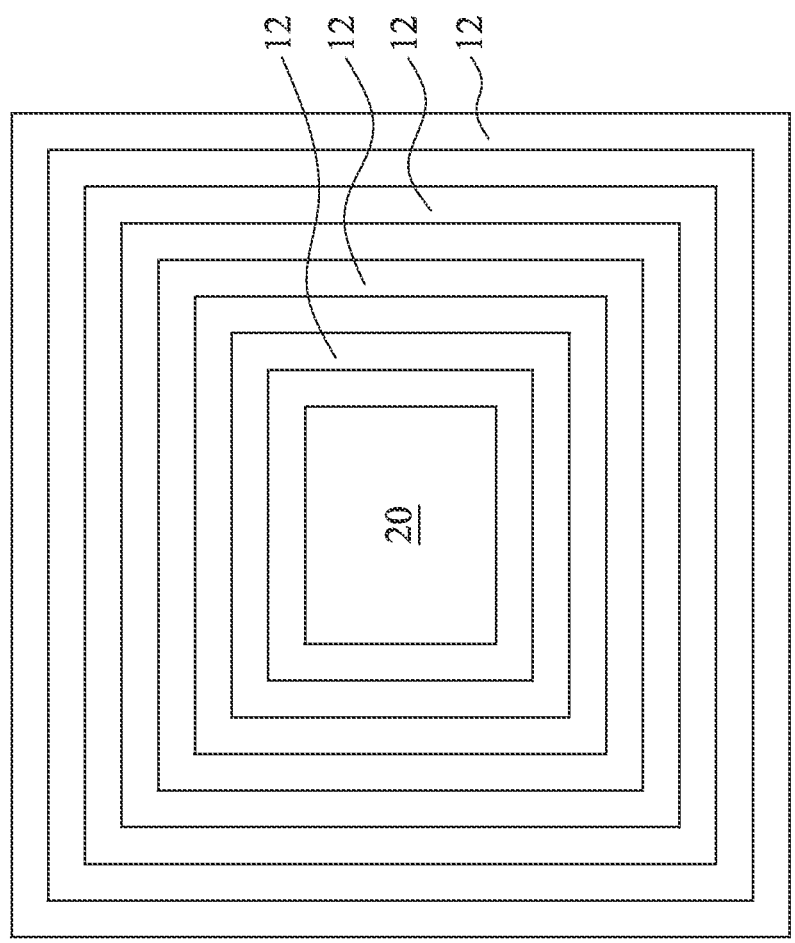

SEMICONDUCTOR WAFER AND SEMICONDUCTOR DIE

BACKGROUND

In a semiconductor process, multiple dies (e.g., image sensor chips) are typically fabricated on a round semiconductor wafer. Scribe lines are provided between two adjacent dies, such that the semiconductor wafer can be cut into individual dies by dicing along those scribe lines.

Unfortunately, the dicing process, using such as a die saw, may damage the physical structure of the die due to lateral stress induced from the dicing process. For example, micro cracks may be produced at edge portions of the die during the dicing process, which may propagate unpredictably into the integrated circuit of the die and destroy it. Such micro cracks are also conduits for the introduction of destructive contaminants, which results in low reliability of the die. In addition, partial or complete delamination of the die may occur in the dicing process, resulting in low production yield. Damages as described above would render the dies unusable and ruin the commercial value of the dies. Therefore, there is a need for an improved structure of the semiconductor wafer to protect the die from damage during the dicing process.

BRIEF DESCRIPTION OF THE DRAWINGS

Embodiments of the present disclosure are best understood from the following detailed description when read with the accompanying figures. It is emphasized that, in accordance with the standard practice in the industry, various features are not drawn to scale. In fact, the dimensions of the various features may be arbitrarily increased or reduced for clarity of discussion.

FIGS. 5A-5C are top views of semiconductor wafers according to various embodiments of the present disclosure.

DETAILED DESCRIPTION

It is to be understood that the following disclosure provides many different embodiments, or examples, for implementing different features of the disclosure. Specific examples of components and arrangements are described below to simplify the present disclosure. These are, of course, merely examples and are not intended to be limiting. Moreover, the formation of a first feature over or on a second feature in the description that follows may include embodiments in which the first and second features are formed in direct contact, and may also include embodiments in which additional features may be formed interposing the first and second features, such that the first and second features may not be in direct contact. Various features may be arbitrarily drawn in different scales for the sake of simplicity and clarity.

The singular forms "a," "an" and "the" used herein include plural referents unless the context clearly dictates otherwise. Therefore, reference to, for example, a substrate includes embodiments having two or more such substrates, unless the context clearly indicates otherwise. Reference throughout this specification to "one embodiment" or "an embodiment" means that a particular feature, structure, or characteristic described in connection with the embodiment is included in at least one embodiment of the present disclosure. Therefore, the appearances of the phrases "in one embodiment" or "in an embodiment" in various places throughout this specification are not necessarily all referring to the same embodiment. Further, the particular features, structures, or characteristics may be combined in any suitable manner in one or more embodiments. It should be appreciated that the following figures are not drawn to scale; rather, these figures are intended for illustration.

Figure 1:
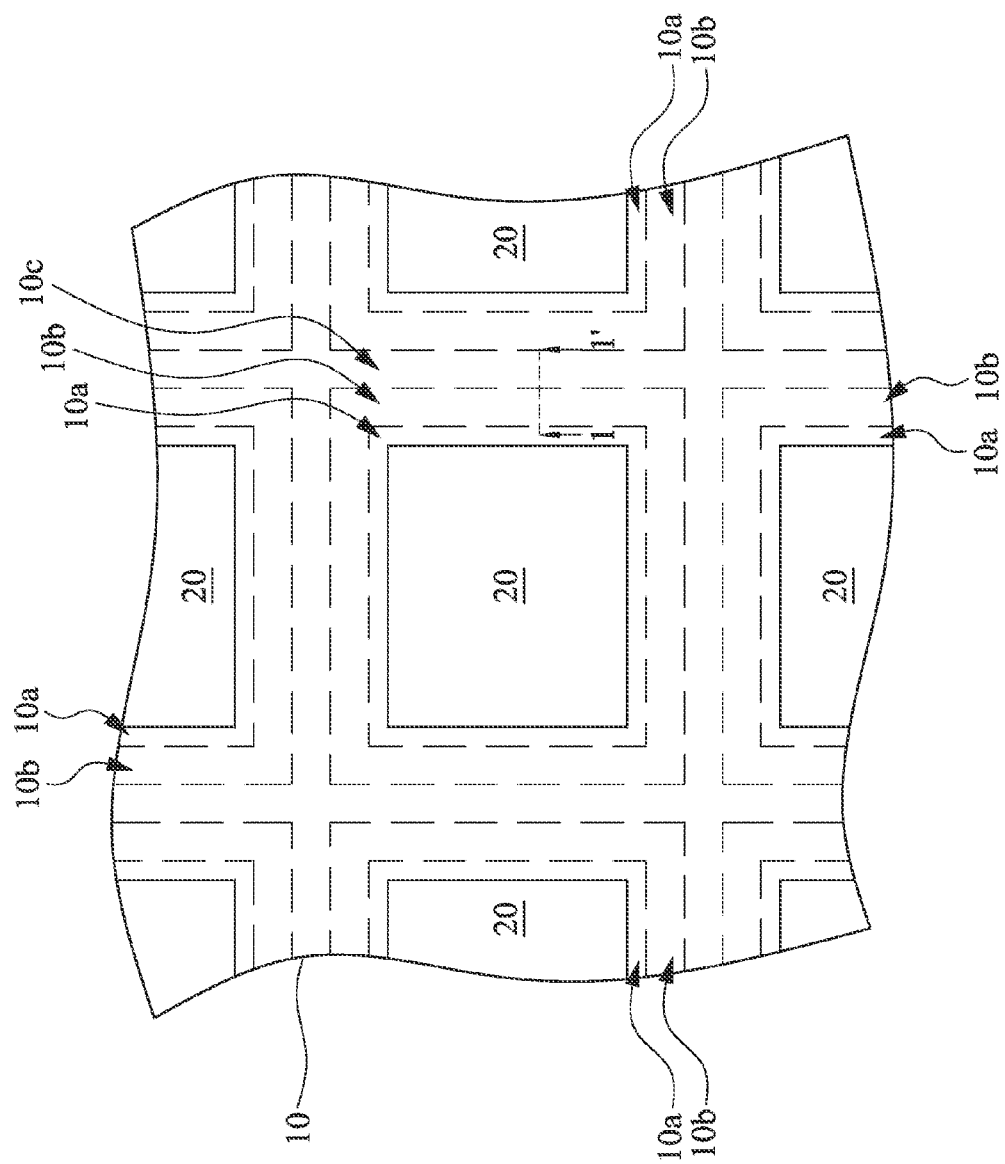
FIG. 1 is a top view of a semiconductor wafer according to various embodiments of the present disclosure.

One aspect of the present disclosure provides a semiconductor wafer including a substrate, an integrated circuit and a die seal ring structure. FIG. 1 is a top view of a semiconductor wafer according to various embodiments of the present disclosure. As shown in FIG. 1, the substrate 10 has a plurality of die regions 10a, a plurality of die seal ring regions 10b and a scribe line region 10c. Each of the die seal ring regions 10b surrounds one of the die regions 10a, and the scribe line region 10c surrounds each die seal ring region 10b. The semiconductor wafer may be cut into a plurality of semiconductor dies by dicing along the scribe line region 10c. A saw may be used in the dicing process. Laser dicing or laser scribing may also be employed to cut the semiconductor wafer.

The substrate 10 is used to provide a structural support to integrated circuits 20, as shown in FIG. 1. The substrate 10 may include an elementary semiconductor including silicon or germanium in crystal, polycrystalline, and/or an amorphous structure; a compound semiconductor including silicon carbide, gallium arsenic, gallium phosphide, indium phosphide, indium arsenide, and/or indium antimonide; an alloy semiconductor including SiGe, GaAsP, AlInAs, AlGaAs, GaInAs, GaInP, and/or GaInAsP; any other suitable material; and/or combinations thereof. The substrate 10 may further include underlying layers, devices and other features (not shown) formed during prior process steps.

Figure 2:
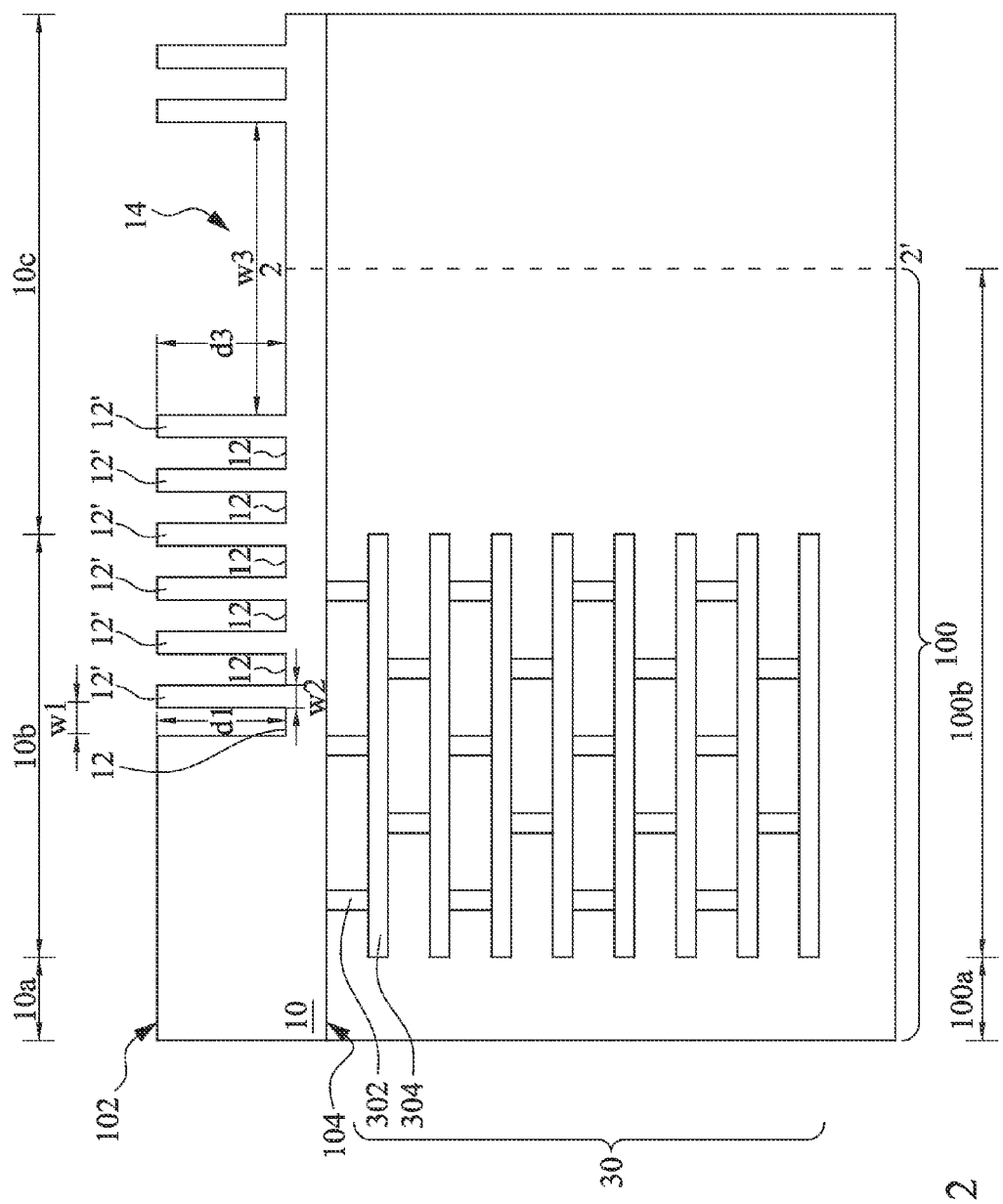
FIG. 2 is a cross-sectional view of the semiconductor wafer along line 1-1' of FIG. 1.

The integrated circuit 20 may be square or rectangular in shape. The integrated circuit 20 is disposed on the die region 10a, as shown in FIG. 1. FIG. 2 is a cross-sectional view of the semiconductor wafer along line 1-1' of FIG. 1. As shown in FIG. 2, the substrate 10 includes a first surface 102 (i.e., a backside of the substrate 10) and a second surface 104 (i.e., a front side of the substrate 10) opposite to the first surface 102. The integrated circuit 20 of FIG. 1, which is not shown in FIG. 2, is disposed on the first surface 102 and the second surface 104 of the die region 10a of the substrate 10. In other words, the integrated circuit 20 of FIG. 1 may be viewed from the first surface (not marked) or the second surface (not marked). In various embodiments, the integrated circuit 20 is a backside illumination (BSI) chip, which is one kind of a complementary metal-dielectric-semiconductor image sensor (CIS) chip. The CIS BSI chip may include a CMOS (not shown) and thin film layers (not shown) respectively disposed on the second surface 104 and the first surface 102.

A die seal ring structure 30 surrounds the integrated circuit 20. The die seal ring structure 30 is disposed on the second surface 104 of the die seal ring region 10b, as shown in FIG. 2. The die seal ring structure 30 may limit the intrusion of cracks into the integrated circuit 20 on the second surface 104 and ensure protection thereof against moisture and contaminants. In the present embodiments, the die seal ring structure 30 includes a plurality of conductive vias 302 and a plurality of patterned metal layers 304 alternately disposed, and the patterned metal layers 304 are electrically connected to each other through the conductive vias 302, but the die seal ring structure 30 of the present disclosure is not limited to those embodiments shown in FIG. 2.

The die seal ring structure 30 can protect the integrated circuit 20 of FIG. 1 on the second surface 104, but fails to protect the integrated circuit 20 of FIG. 1 on the first surface 102. Therefore, lateral stress produced from the dicing process may damage the integrated circuit 20 on the first surface 102 through the substrate 10. Accordingly, the present disclosure provides the substrate 10 of the semiconductor wafer including periodic recesses 12 within the surface 102 of the substrate 10 to prevent damage of the integrated circuit 20 on the first surface 102 during the dicing process, as shown in FIG. 2. Two adjacent periodic recesses 12 define a protrusion 12'. The alternately arranged periodic recesses 12 and the periodic protrusions 12' are used to disperse and release the lateral stress produced from the dicing process, and thus to prevent damage of the integrated circuit 20 on the first surface 102. The periodic recesses 12 may be formed by photolithographic and etching processes or other suitable patterning processes.

Each of the periodic recesses 12 is arranged along an edge of the integrated circuit 20. The periodic recesses 12 may be within the surface 102 of the die seal ring region 10b, the scribe line region 10c or both the die seal ring region 10b and the scribe line region 10c. In the present embodiment, the periodic recesses 12 are within the surface 102 of both the die seal ring region 10b and the scribe line region 10c. In practical applications, a width w1 and a depth d1 of the recess 12 and a width w2 of the protrusion 12' may be appropriately adjusted based on material properties and a thickness (not marked) of the substrate 10 so as to provide good stress relaxation ability.

The substrate 10 further includes a scribe groove 14 within the surface 102 of the scribe line region 10c of the substrate 10 and surrounding the periodic recesses 12. The scribe groove 14 is configured to be diced along the scribe groove 14 itself. For instance, the scribe groove 14 may be symmetrically disposed between two adjacent die seal ring regions 10b. The scribe groove 14 has a width W3 greater than the width W1 of each of the periodic recesses 12. In various embodiments, the scribe groove 14 is simultaneously formed with the periodic recesses 12, such that the scribe groove 14 has a depth d3 substantially same as the depth d1 of the recess 12.

Still referring to FIG. 2, the semiconductor wafer may be diced along the scribe groove 14 by a die saw or laser. The periodic recesses 12 should be retained during the dicing process to prevent damage of the integrated circuit 20 on the first surface 102. For example, the semiconductor wafer is diced along a dotted line 2-2' to obtain a semiconductor die 100. The semiconductor die 100 also includes the substrate 10, the integrated circuit 20 and the die seal ring structure 30. The substrate 10 of the semiconductor die 100 is with a die region 100a and an edge region 100b surrounding the die region 100a, and includes the first surface 102 and the second surface 104. The integrated circuit 20 is located on the first surface 102 and the second surface 104 of the die region 100a of the substrate 10. The die seal ring structure 30 is disposed on the second surface 104 of the edge region 100b of the substrate 10. The substrate 10 includes the periodic recesses 12 within the first surface 102 of the edge region 100b.

Figure 3:
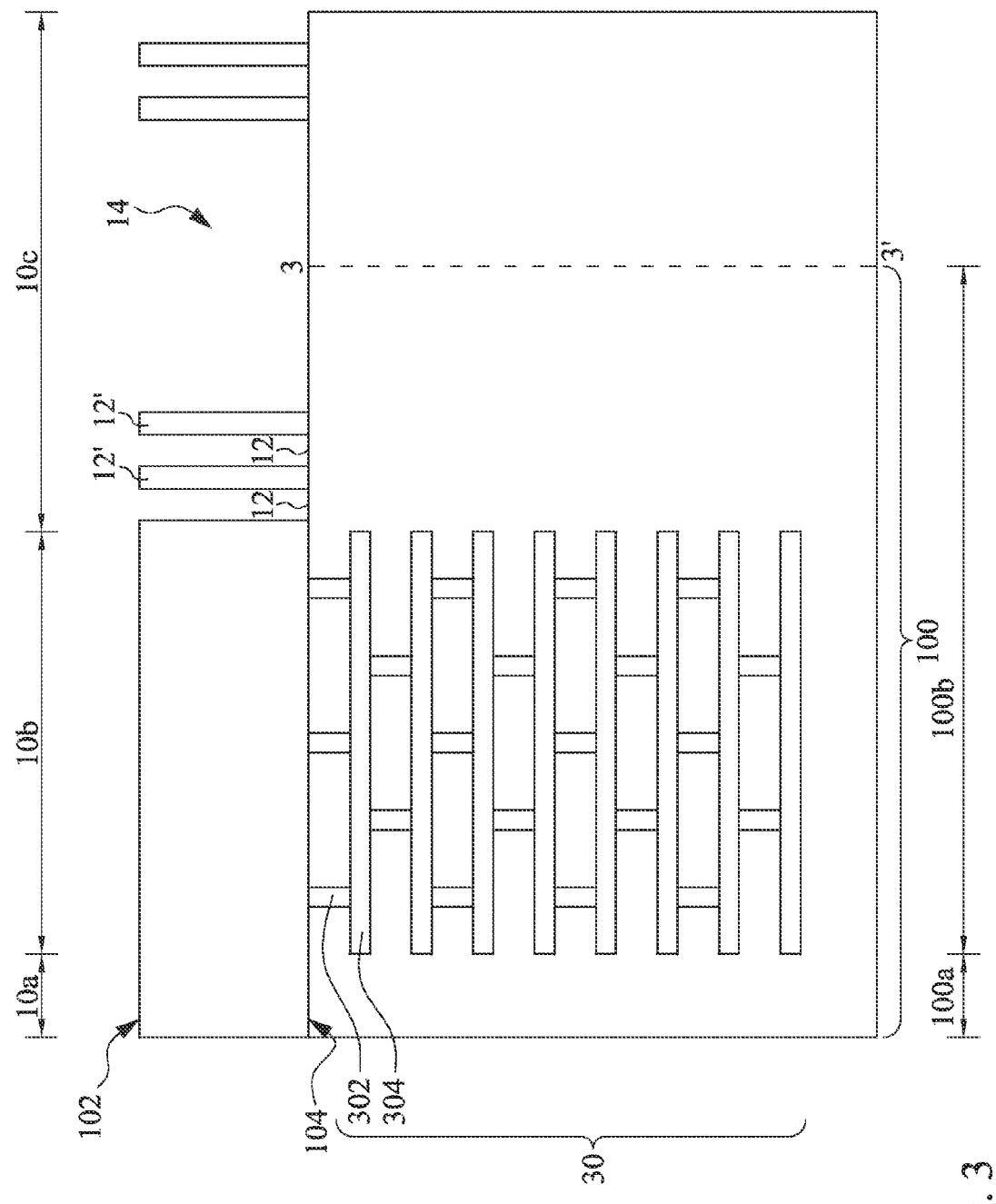
FIG. 3 is a cross-sectional view of the semiconductor wafer along line 1-1' of FIG. 1.

FIG. 3 is a cross-sectional view of the semiconductor wafer along line 1-1' of FIG. 1 according to other embodiments of the present disclosure. The difference between FIG. 3 and FIG. 2 is that the periodic recesses 12 of FIG. 3 are through holes. The through holes are disposed only at the scribe line region 10c. Both the through holes and protrusions 12' can also be used to disperse and release the lateral stress produced from the dicing process, and thus to prevent damage of the integrated circuit 20 on the first surface 102. The semiconductor wafer may be diced along a dotted line 3-3' to obtain a semiconductor die 100. The specific features of the semiconductor die 100 may be referred to those exemplified above for the semiconductor die 100 of FIG. 2, and thus omitted herein.

Figure 4:
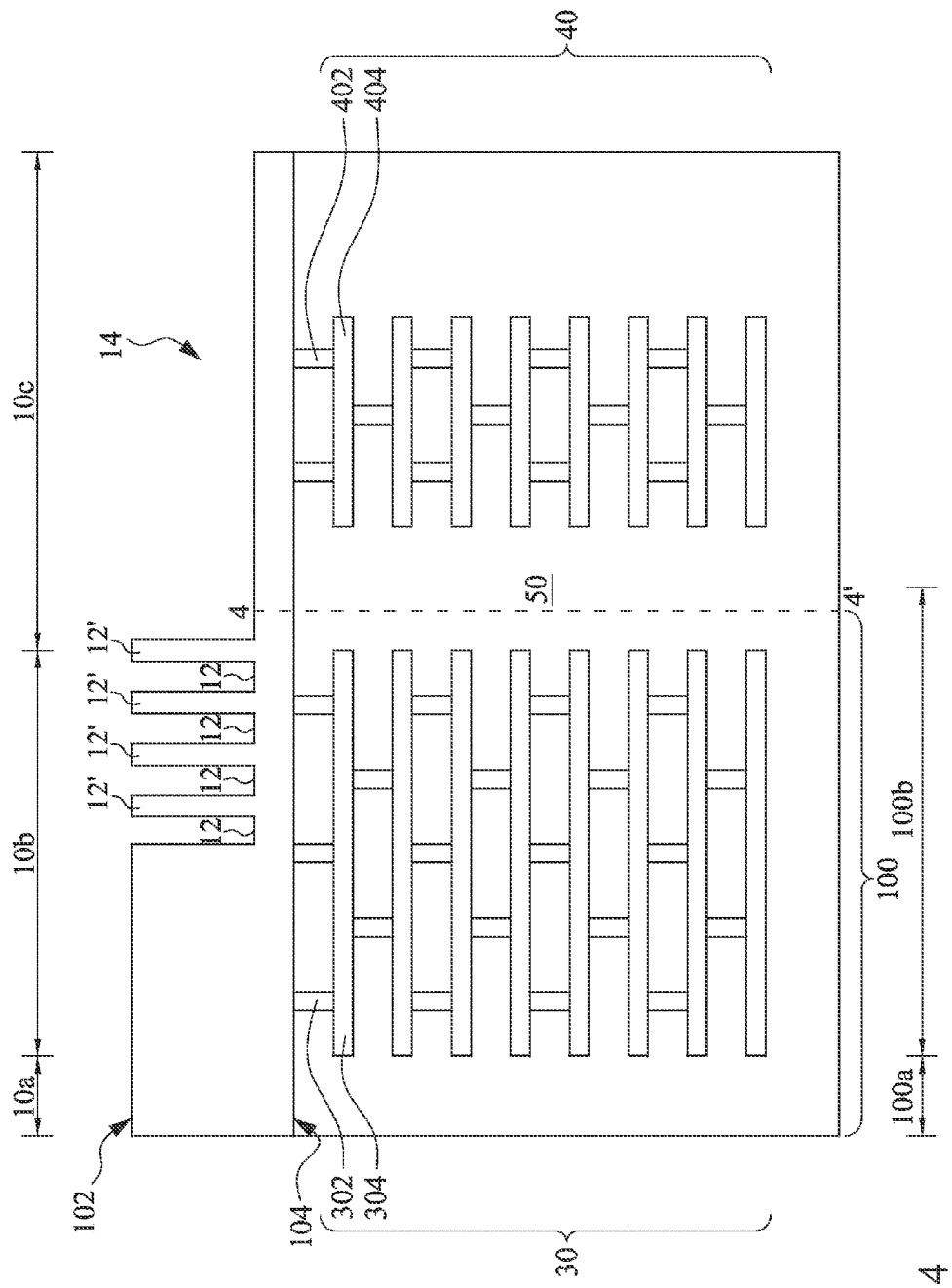
FIG. 4 is a cross-sectional view of the semiconductor wafer along line 1-1' of FIG. 1.

FIG. 4 is a cross-sectional view of the semiconductor wafer along line 1-1' of FIG. 1 according to other embodiments of the present disclosure. The periodic recesses 12 of FIG. 4 are within the surface 102 of only the die seal ring region 10b so as to provide more space for the scribe groove 14. Therefore, in some embodiments, in order to leave more space for the scribe groove 14, at least one of the periodic recesses 12 is within the first surface 102 of the die seal ring region 10b.

As shown in FIG. 4, the semiconductor wafer further includes an outer seal ring structure 40 disposed on the surface 104 of the scribe line region 10c of the substrate 10 and surrounding the die seal ring structure 30. The outer seal ring structure 40 is used to provide further protection of the integrated circuit 20 of FIG. 1 on the second surface 104 against moisture and contaminants. In the present embodiments, the outer seal ring structure 40 includes a plurality of conductive vias 402 and a plurality of patterned metal layers 404 alternately disposed, and the patterned metal layers 404 are electrically connected to each other through the conductive vias 402, but the outer seal ring structure 40 of the present disclosure is not limited to those embodiments shown in FIG. 4.

Still referring to FIG. 4, the semiconductor wafer further includes an insulating structure 50 on the surface 104 of the scribe line region 10c of the substrate 10 and between the die seal ring structure 30 and the outer seal ring structure 40. That is, the insulating structure 50 is used to isolate the die seal ring structure 30 from the outer seal ring structure 40. The insulating structure 50 may be a multilayer structure and made of inorganic dielectric materials, such as silicon oxide, silicon nitride, silicon oxynitride and a combination thereof. The insulating structure 50 is configured to be diced through the semiconductor wafer. For example, the semiconductor wafer may be diced along a dotted line 4-4' through the insulating structure 50 to obtain a semiconductor die 100 so as not to hurt the die seal ring structure 30 and the periodic recesses 12. The specific features of the semiconductor die 100 may be referred to those exemplified above for the semiconductor die 100 of FIG. 2, and thus omitted herein.

Figure 5A:
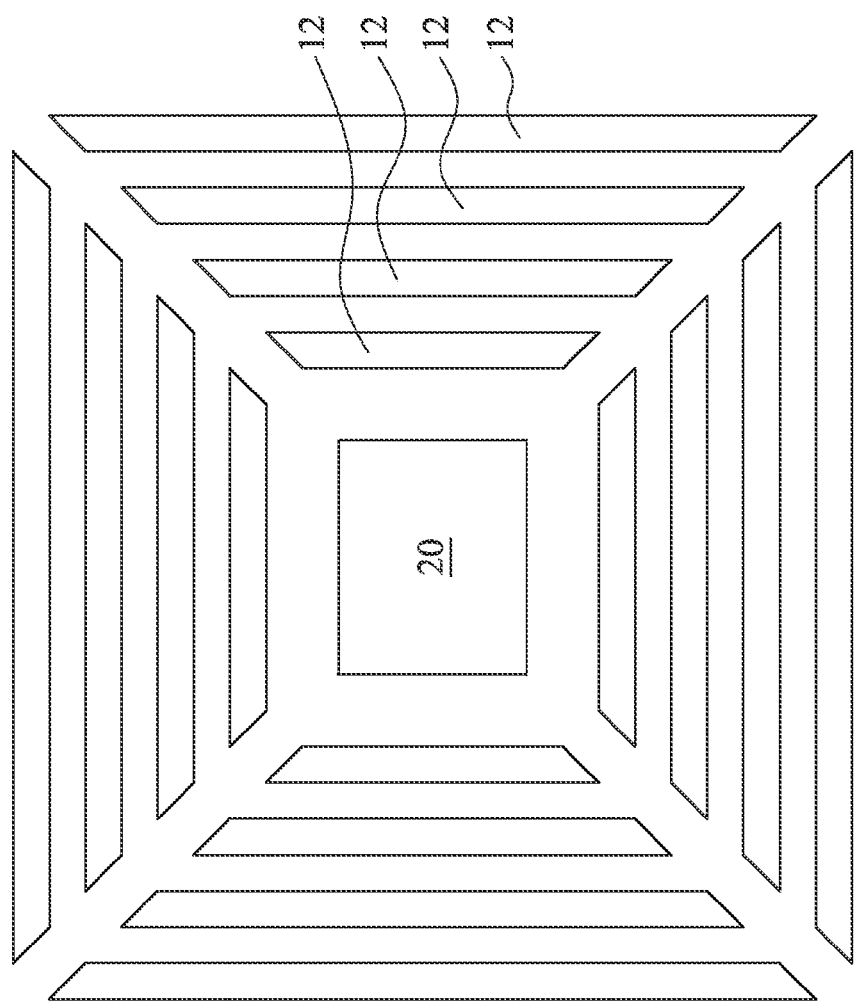

FIGS. 5A-5C are top views of semiconductor wafers according to various embodiments of the present disclosure. Four periodic recesses 12 adjacent each side of an integrated circuit 20 are given as examples, but not limited thereto. The periodic recesses 12 are periodic grooves and arranged along an edge (i.e., four sides) of the integrated circuit 20. In addition, the periodic recesses 12 are substantially parallel to each other. It is noted that the periodic recesses 12 and the integrated circuit 20 are not drawn to scale. The periodic recesses 12 are enlarged in FIGS. 5A-5C in order to clearly show the arrangement of the periodic recesses 12. In fact, an area occupied by the periodic recesses 12 may be much smaller than an area occupied by the integrated circuit 20.

As shown in FIGS. 5A and 5B, the periodic recesses 12 are straight line-shaped recesses surrounding the integrated circuit 20. One protrusion (not marked) is defined after forming the periodic recesses 12. As shown in FIG. 5C, the periodic recesses 12 are ring-shaped recesses surrounding the integrated circuit 20. A plurality of protrusions (not marked) are defined after forming the periodic recesses 12. The protrusion(s) and the periodic recesses 12 can effectively disperse and release the lateral stress produced from the dicing process, and thus to prevent damage of the integrated circuit 20. In practical applications, the shape (i.e., the top profile view) of the periodic recesses 12 may be altered, such as wavy grooves, and thus not limited to those exemplified above.

The foregoing has outlined features of several embodiments so that those skilled in the art may better understand the detailed description that follows. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions and alterations herein without departing from the spirit and scope of the present disclosure.

What is claimed is:

1. A semiconductor wafer, comprising:
a substrate, with a die region, a die seal ring region surrounding the die region and a scribe line region surrounding the die seal ring region, the substrate comprising:
a first surface and a second surface opposite to the first surface;
a plurality of periodic recesses exposed on the first surface and within the die seal ring region;
at least one protrusion between the periodic recesses; and
a scribe groove disposed on the scribe line region and surrounding the periodic recesses;
an integrated circuit on the second surface of the die region; and
a die seal ring structure on the second surface of the die seal ring region, wherein the protrusion protrudes in a direction away from the die seal ring structure.

2. The semiconductor wafer of claim 1, wherein the periodic recesses are periodic grooves.

3. The semiconductor wafer of claim 1, wherein the periodic recesses are substantially parallel to each other.

4. The semiconductor wafer of claim 1, wherein the periodic recesses are periodic straight line-shaped recesses or periodic ring-shaped recesses.

5. The semiconductor wafer of claim 1, wherein each of the periodic recesses is arranged along an edge of the integrated circuit.

6. The semiconductor wafer of claim 1, wherein the scribe groove has a width greater than a width of each of the periodic recesses.

7. The semiconductor wafer of claim 6, wherein the scribe groove is configured to be diced along the scribe groove itself.

8. The semiconductor wafer of claim 1, further comprising an outer seal ring structure on the second surface of the scribe line region of the substrate and surrounding the die seal ring structure.

9. The semiconductor wafer of claim 8, further comprising an insulating structure on the second surface of the scribe line region and between the die seal ring structure and the outer seal ring structure.

10. The semiconductor wafer of claim 9, wherein the insulating structure is configured to be diced through the semiconductor wafer.

11. The semiconductor wafer of claim 1, wherein the integrated circuit is a backside illumination chip.

12. A semiconductor die, comprising:
a substrate, with a die region, a die seal ring region surrounding the die region, and a scribe line region surrounding the die seal ring region, the substrate comprising:
a first surface, a second surface opposite to the first surface;
a plurality of periodic recesses exposing on the first surface and within the die seal ring region;
at least one protrusion between the periodic recesses; and
a scribe groove disposed on the scribe line region and surrounding the periodic recesses;
an integrated circuit on the second surface of the die region; and
a die seal ring structure on the second surface of the die seal ring region, wherein at least one of the periodic recesses is aligned with the die seal ring structure, and the protrusion protrudes in a direction away from the die seal ring structure.

13. The semiconductor die of claim 12, wherein the periodic recesses are periodic grooves.

14. The semiconductor die of claim 12, wherein the periodic recesses are substantially parallel to each other.

15. The semiconductor die of claim 12, wherein the periodic recesses are periodic straight line-shaped recesses or periodic ring-shaped recesses.

16. The semiconductor die of claim 12, wherein each of the periodic recesses is arranged along an edge of the integrated circuit.

17. The semiconductor die of claim 12, wherein the integrated circuit is a backside illumination chip.

18. The semiconductor die of claim 12, wherein the integrated circuit is a complementary metal-dielectric-semiconductor image sensor backside illumination chip.

19. The semiconductor die of claim 12, wherein the scribe groove has a width greater than a width of each of the periodic recesses.

20. The semiconductor die of claim 12, wherein the scribe groove is disposed between two of the plurality of recesses.

* * * * *